United States Patent
Lopez et al.

(10) Patent No.: US 11,886,676 B2
(45) Date of Patent: Jan. 30, 2024

(54) CAPACITIVE TOUCH KEYPAD

(71) Applicant: Schlage Lock Company LLC, Carmel, IN (US)

(72) Inventors: Jenna Lopez, Indianapolis, IN (US); Maxwell Watson, Lakewood, CO (US); Sukanya Ranganathan, Breslau (CA); Frank A. Nardelli, Indianapolis, IN (US)

(73) Assignee: Schlage Lock Company LLC, Carmel, IN (US)

( * ) Notice: Subject to any disclaimer, the term of this patent is extended or adjusted under 35 U.S.C. 154(b) by 0 days.

(21) Appl. No.: 17/566,837

(22) Filed: Dec. 31, 2021

(65) Prior Publication Data

US 2023/0214071 A1    Jul. 6, 2023

(51) Int. Cl.
*G06F 3/044* (2006.01)
*H03K 17/96* (2006.01)
*G06F 3/047* (2006.01)

(52) U.S. Cl.
CPC ........... *G06F 3/0446* (2019.05); *G06F 3/047* (2013.01); *H03K 17/962* (2013.01); *H03K 2217/960755* (2013.01)

(58) Field of Classification Search
CPC ..... G06F 3/0446; G06F 3/047; H03K 17/962; H03K 2217/960755; G07C 9/00174
See application file for complete search history.

(56) References Cited

U.S. PATENT DOCUMENTS

| | | | |
|---|---|---|---|
| 6,331,850 B1 * | 12/2001 | Olodort | H03M 11/20 361/679.13 |
| 8,358,276 B2 | 1/2013 | Hotelling et al. | |
| 8,605,037 B2 | 12/2013 | Philipp et al. | |
| 9,256,333 B2 | 2/2016 | Singh et al. | |
| 10,120,509 B2 | 11/2018 | Chandran et al. | |
| 10,429,998 B2 | 10/2019 | Ogirko et al. | |
| 2002/0110237 A1 * | 8/2002 | Krishnan | G06F 3/0234 379/419 |
| 2010/0139991 A1 * | 6/2010 | Philipp | G06F 3/0418 178/18.06 |
| 2012/0032916 A1 | 2/2012 | Enoki | |

(Continued)

FOREIGN PATENT DOCUMENTS

CN    207131206 U  *  3/2018

OTHER PUBLICATIONS

International Search Report; International Searching Authority; International Application No. PCT/US2023/010053; dated May 5, 2023; 2 pages.

(Continued)

*Primary Examiner* — Benjamin C Lee
*Assistant Examiner* — Nathan P Brittingham
(74) *Attorney, Agent, or Firm* — Taft Stettinius & Hollister LLP

(57) ABSTRACT

An exemplary an access control device generally includes a keypad assembly, an antenna, and a controller. The keypad assembly includes a capacitive touch keypad matrix, and the antenna is substantially coplanar with the capacitive touch keypad matrix. The controller is connected with each of the keypad assembly and the antenna such that the controller is operable to receive access codes via each of the keypad assembly and the antenna.

12 Claims, 6 Drawing Sheets

(56) References Cited

U.S. PATENT DOCUMENTS

| | | | |
|---|---|---|---|
| 2013/0082933 A1* | 4/2013 | Liang | G06F 3/021 345/169 |
| 2014/0225849 A1 | 8/2014 | Anno et al. | |
| 2016/0115713 A1* | 4/2016 | Lin | E05B 17/002 70/266 |
| 2017/0017343 A1 | 1/2017 | Chen et al. | |

OTHER PUBLICATIONS

Written Opinion of the International Searching Authority; International Searching Authority; International Application No. PCT/US2023/010053; dated May 5, 2023; 10 pages.

* cited by examiner

CAPACITIVE TOUCH KEYPAD

TECHNICAL FIELD

The present disclosure generally relates to capacitive touch keypads, and more particularly but not exclusively relates to access control devices including such keypads.

BACKGROUND

In certain circumstances, it may be desirable to provide an electronic access control device (e.g., a lock or a reader) with a both a capacitive touch keypad and a smart card reader. However, this can be a challenge because capacitive touch signals are susceptible to noise interference, and a smart card reader antenna radiating in close proximity to the keypad matrix can couple onto the capacitive touch lines of the keypad matrix. In some situations, such as when the antenna and the keypad matrix are in close proximity to one another, this coupling can induce false key presses and other issues.

Some existing approaches to avoiding the coupling of the antenna with the capacitive keypad matrix involve separating the two components by a distance. For example, the capacitive matrix and the antenna may be provided on separate printed circuit board assemblies (PCBAs). However, separating the two components often requires that the overall product have a greater size, particularly when separate PCBAs are utilized. The use of separate PCBAs also introduces cost and complexity, both of which are generally undesirable. For these reasons among others, there remains a need for further improvements in this technological field.

SUMMARY

An exemplary an access control device generally includes a keypad assembly, an antenna, and a controller. The keypad assembly includes a capacitive touch keypad matrix, and the antenna is substantially coplanar with the capacitive touch keypad matrix. The controller is connected with each of the keypad assembly and the antenna such that the controller is operable to receive access codes via each of the keypad assembly and the antenna. Further embodiments, forms, features, and aspects of the present application shall become apparent from the description and figures provided herewith.

DETAILED DESCRIPTION OF ILLUSTRATIVE EMBODIMENTS

Figure 1:
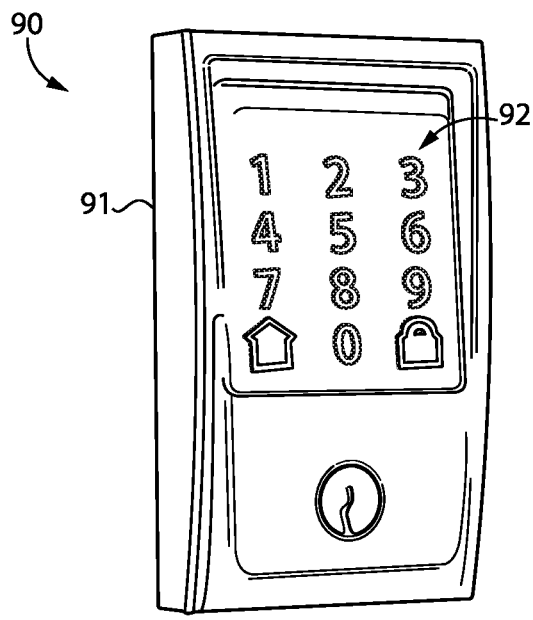
FIG. 1 is a perspective illustration of an access control device according to certain embodiments.

Although the concepts of the present disclosure are susceptible to various modifications and alternative forms, specific embodiments have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. It should further be appreciated that although reference to a "preferred" component or feature may indicate the desirability of a particular component or feature with respect to an embodiment, the disclosure is not so limiting with respect to other embodiments, which may omit such a component or feature. Further, when a particular feature, structure, or characteristic is described in connection with an embodiment, it is submitted that it is within the knowledge of one skilled in the art to implement such feature, structure, or characteristic in connection with other embodiments whether or not explicitly described.

Additionally, it should be appreciated that items included in a list in the form of "at least one of A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C). Items listed in the form of "A, B, and/or C" can also mean (A); (B); (C); (A and B); (B and C); (A and C); or (A, B, and C). Further, with respect to the claims, the use of words and phrases such as "a," "an," "at least one," and/or "at least one portion" should not be interpreted so as to be limiting to only one such element unless specifically stated to the contrary, and the use of phrases such as "at least a portion" and/or "a portion" should be interpreted as encompassing both embodiments including only a portion of such element and embodiments including the entirety of such element unless specifically stated to the contrary.

In the drawings, some structural or method features may be shown in certain specific arrangements and/or orderings. However, it should be appreciated that such specific arrangements and/or orderings may not necessarily be required. Rather, in some embodiments, such features may be arranged in a different manner and/or order than shown in the illustrative figures unless indicated to the contrary. Additionally, the inclusion of a structural or method feature in a particular figure is not meant to imply that such feature is required in all embodiments and, in some embodiments, may be omitted or may be combined with other features.

The disclosed embodiments may, in some cases, be implemented in hardware, firmware, software, or a combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

Figure 2:
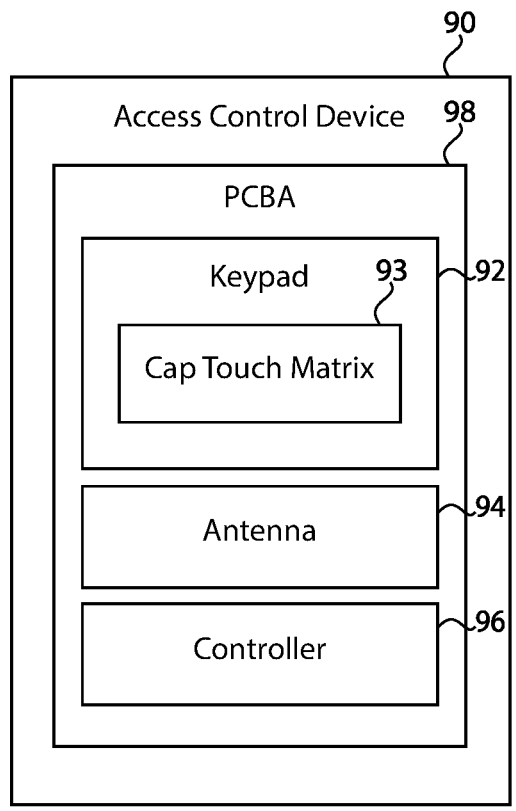
FIG. 2 is a schematic block diagram of the access control device illustrated in FIG. 1.

With reference to FIGS. 1 and 2, illustrated therein is an access control device 90 according to certain embodiments. In the illustrated form, the access control device 90 is provided in the form of a credential reader, and generally includes a housing 91, a capacitive touch keypad 92, an antenna 94, and a controller 96 in communication with the keypad 92 and the antenna 94. As described herein, the keypad 92 includes a capacitive touch matrix 93 that transmits signals to the controller 96 when the keypad 92 is touched by a user. In certain embodiments, the capacitive touch matrix 93 and the antenna 94 may be provided on a single printed circuit board assembly (PCBA) 98, which may further include the controller 96.

The keypad 92 is configured to facilitate user input of an access code, and in the illustrated form is configured to facilitate entry of a numerical access code. It is also contemplated that the keypad 92 may be configured to facilitate entry of another form of access code, such as an access code including letters and/or other symbols. The controller 96 is configured to perform one or more actions in response to the entry of an access code via the keypad 92. For example, in response to the entered access code matching an authorized access code, the controller 96 may transmit an unlock signal that causes a lock mechanism to unlock. In certain embodiments, the lock mechanism may be integrated with the access control device 90. It is also contemplated that the lock mechanism may be separate from the access control device.

The antenna 94 is configured to facilitate transmission of an access code from a physical credential (e.g., a mobile device, a smart card, a proximity card, and/or another physical credential) to the controller 96. In the illustrated embodiment, the antenna 94 is configured to operate on the 13.56 MHz band to communicate with smart cards. It is also contemplated that the antenna 94 may be configured to operate on another frequency band in addition or as an alternative to the 13.56 MHz band, for example to communicate with another form of physical credential. The controller 96 is configured to perform one or more actions in response to the receipt of an access code via the antenna 94. For example, in response to the received access code matching an authorized access code, the controller 96 may transmit an unlock signal that causes a lock mechanism to unlock. As noted above, the lock mechanism may be integrated with the access control device 90, or may be separate from the access control device 90.

Figure 3:
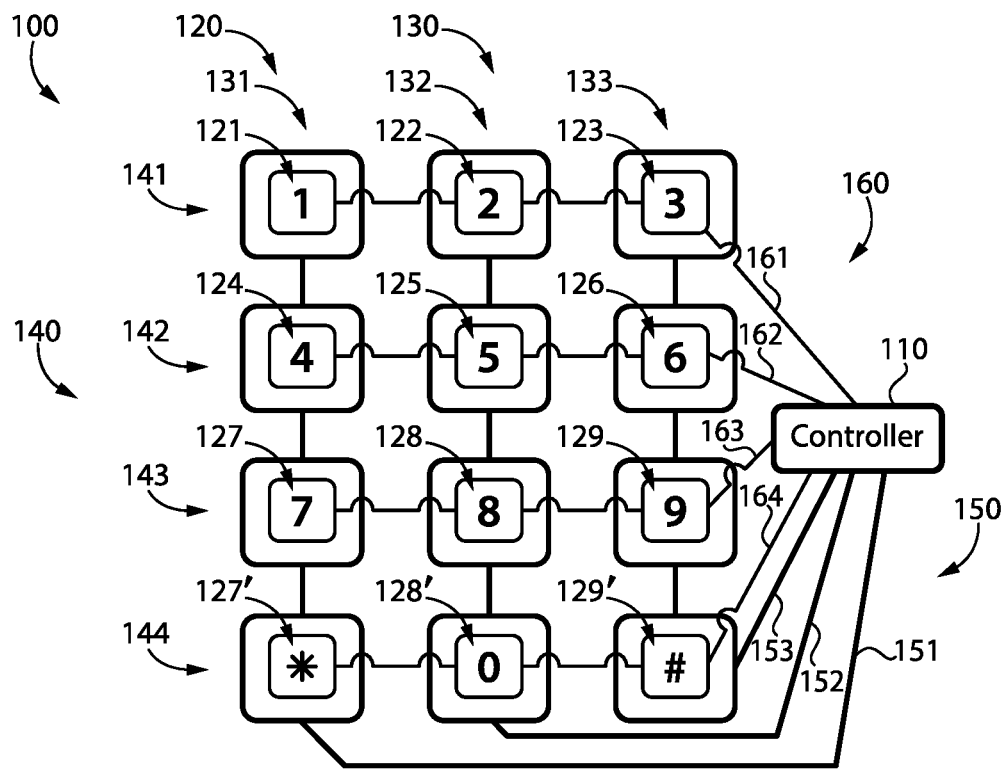
FIGS. 3 and 4 are schematic wiring diagrams of a capacitive touch keypad matrix according to certain embodiments.

With additional reference to FIG. 3, illustrated therein is a capacitive touch keypad assembly 100. The keypad assembly 100 generally includes a controller 110, a plurality of touch-sensitive key locations 120 arranged in a plurality of columns 130 and a plurality of rows 140, a plurality of transmit lines 150 connecting the controller 110 with the columns 130, and a plurality of receive lines 160 connecting the rows 140 with the controller 110.

The plurality of touch-sensitive key locations 120 includes twelve key locations 121-129', including a "1" key location 121, a "2" key location 122, a "3" key location 123, a "4" key location 124, a "5" key location 125, a "6" key location 126, a "7" key location 127, an "8" key location 128, a "9" key location 129, a "*" key location 127', a "0" key location 128', and a "#" key location 129'. The key locations 121-129' are arranged in first through third columns 131-133 and first through fourth rows 141-144. For example, the "1" key location 121 is located in the first column 131 and the first row 141, and the "8" key location 128 is located in the second column 132 and the third row 143.

The plurality of transmit lines 150 includes a number of transmit lines corresponding to the number of columns 130. In the illustrated embodiment, the assembly 100 includes first through third transmit lines 151-153, each of which extends from the controller 110 to a corresponding and respective one of the first through third columns 131-133. More particularly, a first column transmit line 151 connects the controller 110 to the first column 131, a second column transmit line 152 connects the controller 110 to the second column 132, and a third column transmit line 153 connects the controller 110 to the third column 133.

The plurality of receive lines 160 includes a number of receive lines corresponding to the number of rows 140. In the illustrated embodiment, the assembly 100 includes first through fourth receive lines 161-164, each of which extends between the controller 110 and a corresponding and respective one of the first through fourth rows 141-144. More particularly, a first row receive line 161 connects the first row 141 to the controller 110, a second row receive line 162 connects the second row 142 to the controller 110, a third row receive line 163 connects the third row 143 to the controller 110, and a fourth row receive line 164 connects the fourth row 144 to the controller 110.

When a user touches a particular key location (e.g., using a finger or a stylus), the capacitance of the loop including the particular key location alters in a manner that can be detected by the controller 110 such that the controller 110 can determine which key location was touched. This detection of the pressing of a key location based upon altered capacitance is known in the art, and need not be described in detail herein.

Figure 4:
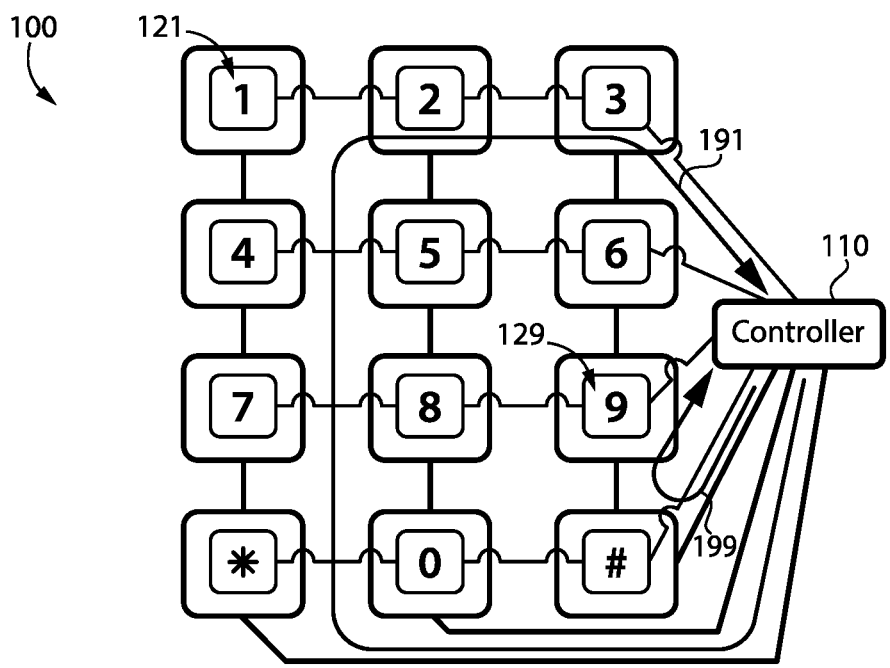

With additional reference to FIG. 4, one drawback associated with the keypad assembly 100 illustrated in FIG. 3 relates to the formation of antenna-like loops. For example, while the lines connecting the controller 110 with the "9" key location 129 form a relatively small loop 199, the lines connecting the controller 110 with the "1" key location 121 form a relatively large loop 191. It has been found that the larger the loop, the more susceptible the loop is to noise and coupling with an electromagnetic field, such as that produced by an antenna. This noise and/or coupling can result in changes in the capacitance of the loop, which the controller 110 may falsely interpret as a key press.

Figure 5:
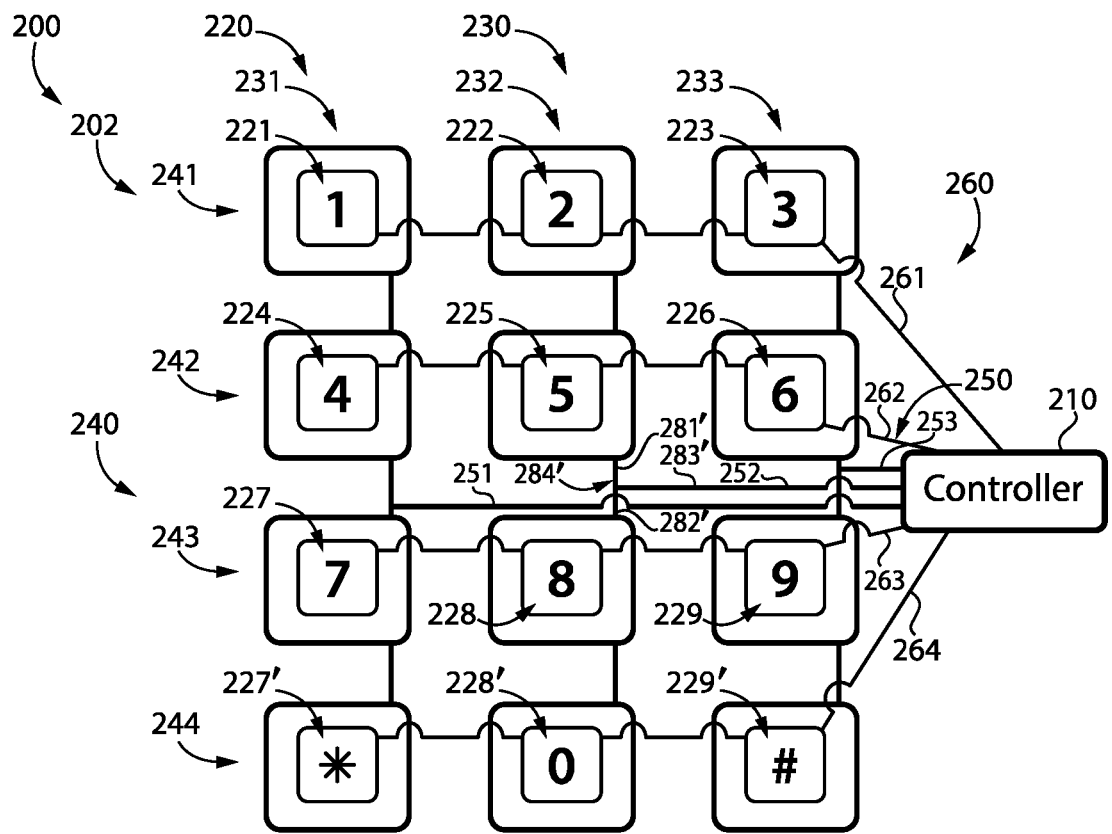
FIG. 5 is a schematic wiring diagram of a capacitive touch keypad matrix according to certain embodiments.

With additional reference to FIG. 5, illustrated therein is a keypad assembly 200 according to certain embodiments. The keypad assembly 200 generally includes a controller 210 and a capacitive touch keypad matrix 202 according to certain embodiments. The capacitive touch keypad matrix 202 generally includes a plurality of touch-sensitive key locations 220 arranged in a plurality of columns 230 and a plurality of rows 240, a plurality of first lines 250 connecting the controller 210 with the columns 230, and a plurality of second lines 260 connecting the rows 240 with the controller 210.

In the illustrated form, the first lines 250 are transmit lines and the second lines 260 are receive lines. It is also contemplated that the first lines 250 may be receive lines and the second lines 260 may be transmit lines. Moreover, while the columns 230 are illustrated as being generally vertical and the rows 240 are illustrated as being generally horizontal, the columns 230 need not be vertical, and the rows 240 need not be horizontal. For example, the horizontal groups referred to herein as rows 240 may be considered to define "columns," and the vertical groups referred to herein as columns 230 may be considered to define "rows." It should further be noted that although the illustrated embodiment includes three columns 230 and four rows 240, more or fewer columns 230 and/or rows 240 may be utilized.

The plurality of touch-sensitive key locations 220 includes twelve key locations 221-229', including a "1" key location 221, a "2" key location 222, a "3" key location 223, a "4" key location 224, a "5" key location 225, a "6" key location 226, a "7" key location 227, an "8" key location 228, a "9" key location 229, a "*" key location 227', a "0" key location 228', and a "#" key location 229'. It is also contemplated that additional or alternative symbols (including but not limited to alphanumeric symbols) may be utilized. The key locations 221-229' are arranged in first through third columns 231-233 and first through fourth rows 241-244. For example, the "1" key location 221 is located in the first column 231 and the first row 241, and the "0" key location 228' is located in the second column 232 and the fourth row 244.

In the illustrated form, each key location 220 includes a corresponding and respective indicium. For example, the "5" key location includes a "5", and the "#" key location includes a "#". The indicia may, for example, be printed or otherwise provided on a cover layer that overlays a printed circuit board that includes the capacitive touch keypad matrix 202.

Each of the first or transmit lines 250 connects the controller 210 with a corresponding one of the columns 230, and each of the second or receive lines 260 connects the controller 210 with a corresponding one of the rows 240. For example, a first column transmit line 251 connects the controller 210 to the first column 231, the second column transmit line 252 connects the controller 210 to the second column 232, and the third column transmit line 253 connects the controller 210 to the third column 233. Similarly, the first row receive line 261 connects the first row 241 to the controller 210, the second row receive line 262 connects the second row 242 to the controller 210, the third row receive line 263 connects the third row 243 to the controller 210, and the fourth row receive line 264 connects the fourth row 244 to the controller 210.

In the embodiment illustrated in FIGS. 3 and 4, all key locations 120 in a particular column 130 are connected with the controller 110 in electrical series. For example, the first transmit line 151 connects the "1" key location 121, the "4" key location 124, the "7" key location 127, and the "*" key location 127' in electrical series. As described herein, however, in the illustrated form, two or more key locations 220 of each column 230 are connected with the controller 210 in electrical parallel.

Figure 6:
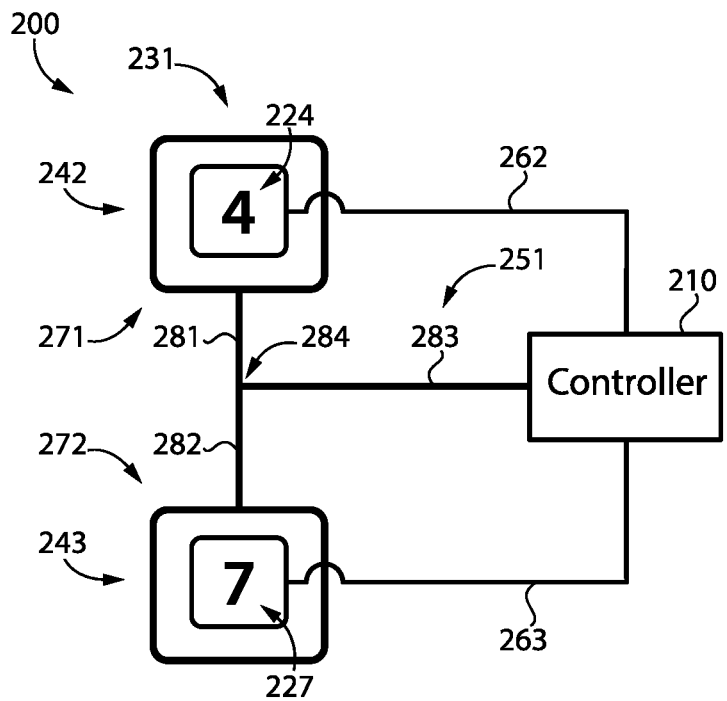
FIG. 6 is a simplified diagram illustrating a portion of the capacitive touch keypad matrix illustrated in FIG. 4.

With additional reference to FIG. 6, illustrated therein is a simplified diagram of a portion of the keypad assembly 200. More particularly, FIG. 6 illustrates, among other features, the parallel electrical connection of two key locations 224, 227 with the controller 210. As noted above, the at least one first column transmit line 251 connects the first column 231 with the controller 210. The at least one first column transmit line 251 includes a first branch 281 connected between the controller 210 and a first key location (in the illustrated form, the "4" key location 224), and a second branch 282 connected between the controller 210 and a second key location (in the illustrated form, the "7" key location 227) such that the first branch 281 and the first key location 224 are in electrical parallel with the second branch 282 and the second key location 247.

In the illustrated form, the at least one first column transmit line 251 is a single split line that further includes a third branch 283 extending from the controller 210 to a junction 284 from which the first and second branches 281, 282 extend in different directions such that the first and second key locations (e.g., the "4" and "7" key locations 224, 227) are positioned on opposite sides of the first branch 281 and are connected with the controller 210 in electrical parallel with one another. Stated another way, the illustrated first transmit line 251 includes a first branch 281 extending from the junction 284 to a first key location (in the illustrated form, the "4" key location 224), and a second branch 282 extending from the junction 284 to a second key location (in the illustrated form, the "7" key location 227) such that the first and second key locations (e.g., the "4" and "7" key locations 224, 227) are positioned on opposite sides of the junction 284 and are connected with the controller 210 in electrical parallel with one another. In the illustrated form, the junction 284 is a three-way junction, and more particularly a T-junction. It is also contemplated that the junction 284 may be another form of junction, such as a Y-junction or a junction that connects more than three branches.

In the illustrated arrangement, the keypad assembly 200 includes a first pathway 271 and a second pathway 272 extending in electrical parallel between the junction 284 and the controller 210. The first pathway 271 includes the first branch 281, the first key location (in the illustrated form, the "4" key location 224), and a first receive line (in the illustrated form, the second row receive line 262). The second pathway 272 includes the second branch 282, the second key location (in the illustrated form, the "7" key location 227), and a second receive line (in the illustrated form, the third row receive line 263).

While FIG. 6 illustrates the first column transmit line 251 and the branches thereof, it should be appreciated that one or more of the other transmit lines 252, 253 may include similar features. For example, the second column transmit line 252 may include a second transmit line first branch 281' and a second transmit line second branch 282' that meet a second transmit line third branch 283' at a second junction 284'. In such forms, the second transmit line first branch 281' may be connected between the second junction 284' and a third key location (e.g., the "5" key location 225), and the second transmit line second branch 282' may be connected between the second junction 284' and a fourth key location (e.g., the "8" key location 228) such that the third and fourth key locations (e.g., the "5" and "8" key locations 225, 228) are in electrical parallel with one another.

Figure 7:
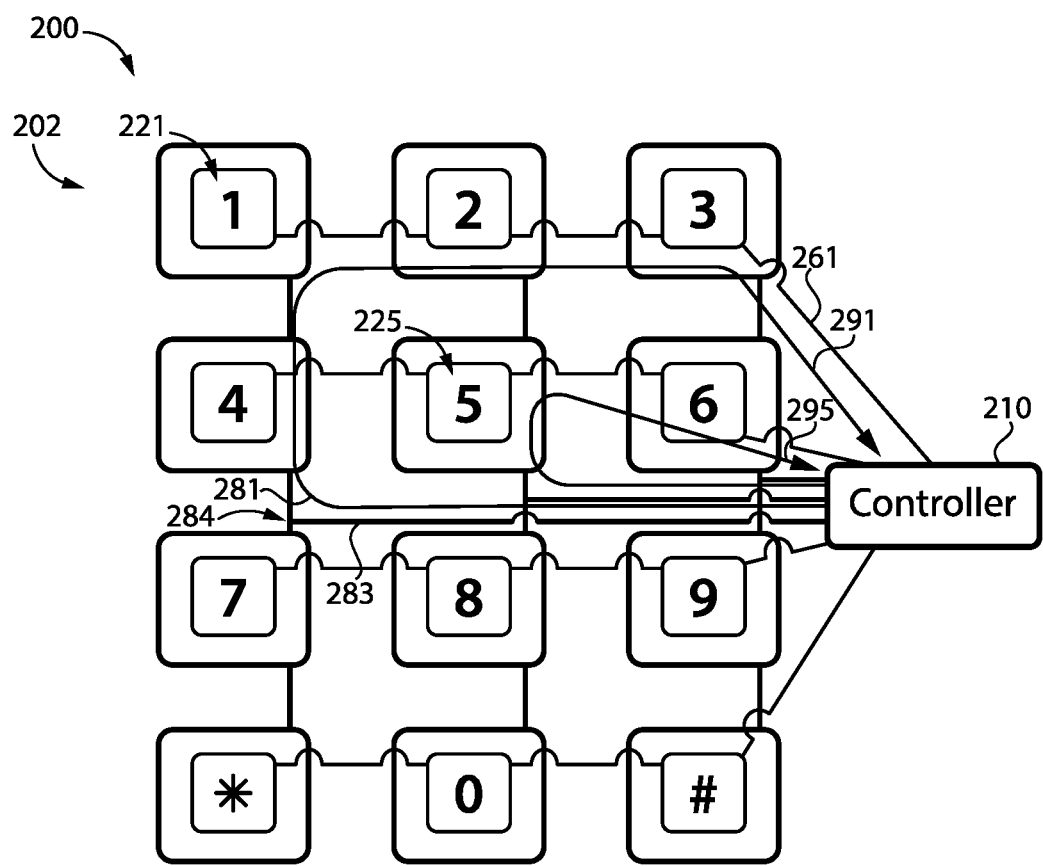
FIG. 7 is a schematic wiring diagram of the capacitive touch keypad matrix illustrated in
FIG. 5.

With additional reference to FIG. 7, it should be appreciated that the concepts described in connection with the keypad assembly 200 may be utilized to decrease the size of the loops formed by the various lines. For example, FIG. 7 illustrates a loop 291 including the "1" key location 221. The loop 291 extends from the controller 210 to the junction 284 via the third branch 283, from the junction 284 to the "1" key location 221 via the first branch 281, and returns from the "1" key location 221 to the controller 210 via the first row receive line 261. As should be evident from a comparison of FIGS. 4 and 7, the first key location loop 291 in the keypad assembly 200 is significantly shorter and covers significantly less area than the corresponding first key location loop 191 in the keypad assembly 100. These features may result in an appreciable decrease in the noise received by the controller 110 and/or a reduced likelihood of coupling with the electromagnetic field of an antenna.

Figure 8:
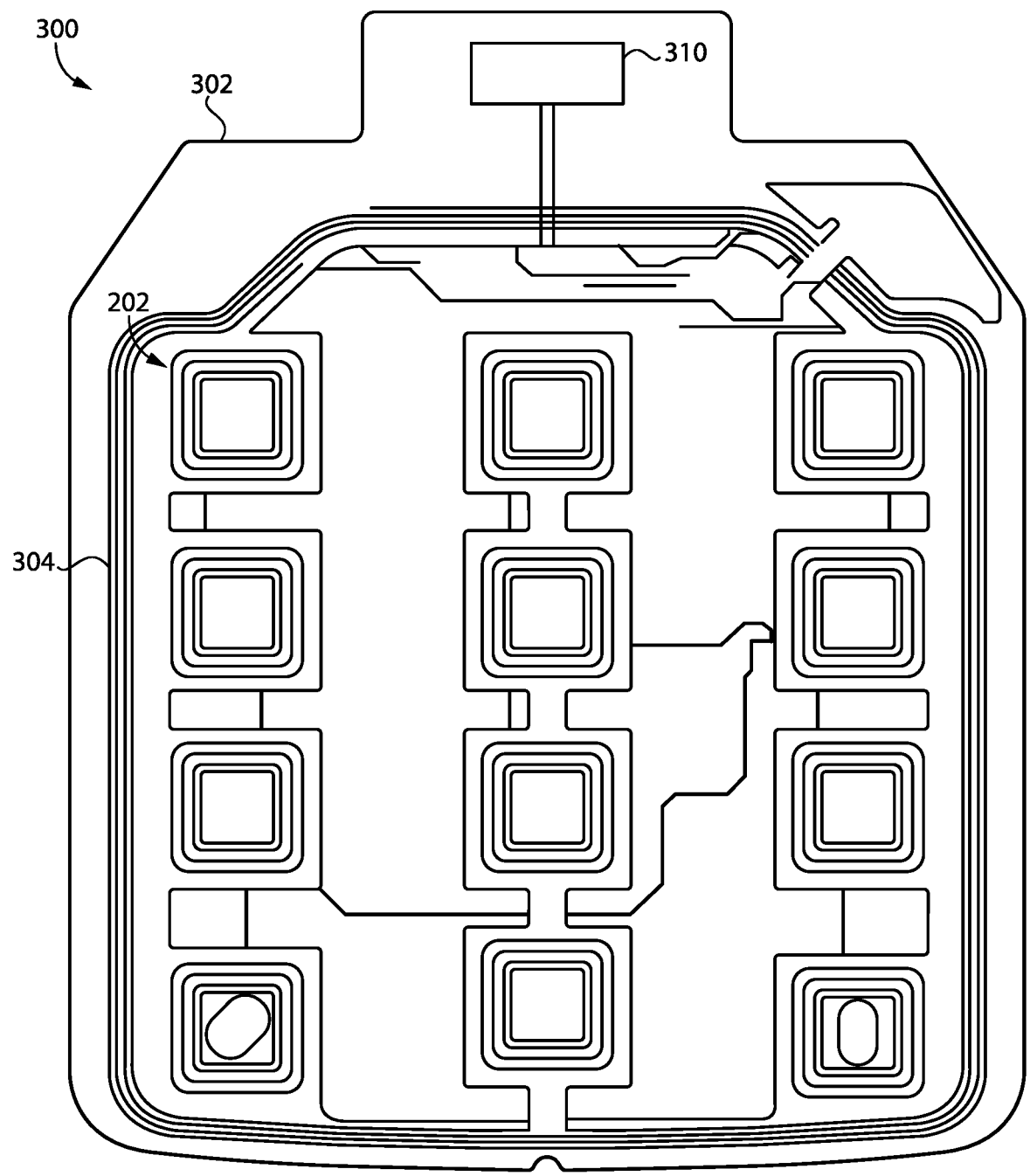
FIG. 8 is a plan view of a printed circuit board assembly including the capacitive touch keypad matrix illustrated in FIG. 5.

With additional reference to FIG. 8, illustrated therein is a printed circuit board assembly (PCBA) 300 according to certain embodiments. The PCBA 300 may, for example, be utilized as the PCBA 98 of the access control device 90. The PCBA 300 generally includes a printed circuit board (PCB) 302 including the capacitive touch keypad matrix 202 described above and an antenna 304, and a controller 310 in communication with the capacitive touch keypad matrix 202 and the antenna 304. Certain components of the keypad matrix 202, such as the transmit lines and/or the return lines, may be formed as traces on the PCB 302. In certain embodiments, the controller 310 may be mounted to the PCB 302. The antenna 304 is an example of the antenna 94, and may perform one or more of the functions described in association with the antenna 94. Similarly, the controller 310 is an example of the controller 96 and the controller 210, and may perform one or more of the functions described in association with those components.

As noted above, the shortening of the loops and the reduction in area of such loops may reduce the noise transmitted to the controller 310 and/or the susceptibility of the keypad matrix 202 to coupling with the electromagnetic field generated by an antenna. This combination of features may enable the antenna 304 and the keypad matrix 202 to be positioned in a substantially coplanar arrangement, a feature that would not be practical using the keypad assembly 100 due to the generation of noise and electrical coupling with the electromagnetic field generated by the antenna 304.

As used herein, the term "substantially coplanar" may be used to indicate that two items are within 3 mm of being coplanar with one another. For example, the capacitive touch keypad matrix 202 may be described as being "substantially coplanar" with the antenna 304 when the keypad matrix 202 and the antenna 304 are formed on the same PCB 302. Thus, the keypad matrix 202 and the antenna 304 may be considered to be substantially coplanar even in embodiments in which the keypad matrix 202 and the antenna 304 are formed on different layers of the PCB 302.

While other arrangements are contemplated, in the illustrated form, the antenna 304 circumferentially surrounds the keypad matrix 202, which may provide for a reduction in space requirements. Moreover, the provision of both the keypad matrix 202 and the antenna 304 in a substantially coplanar arrangement (e.g., provided on the same PCB 302) may further reduce space requirements. As noted above, these reductions in space requirements may be one result of the concepts described in association with the keypad assembly 200 and the potential advantages thereof (e.g., reduced noise and/or reduced susceptibility to coupling with the electromagnetic field of the antenna 304).

In the illustrated embodiment, both the keypad matrix 202 and the antenna 304 are directly connected to the same controller 310. However, it should be appreciated that this arrangement is an example only, and that other arrangements may be utilized. By way of example, one or both of the keypad matrix 202 and/or the antenna 304 may have associated therewith a dedicated controller, and the one or more dedicated controllers may be in communication with the controller 310 that facilitates communication with an external device, such as an access control device mounted on the interior side of the door. In such forms, the keypad matrix 202 and the antenna 304 may nonetheless be considered to be in indirect communication with the controller 310.

Figure 9:
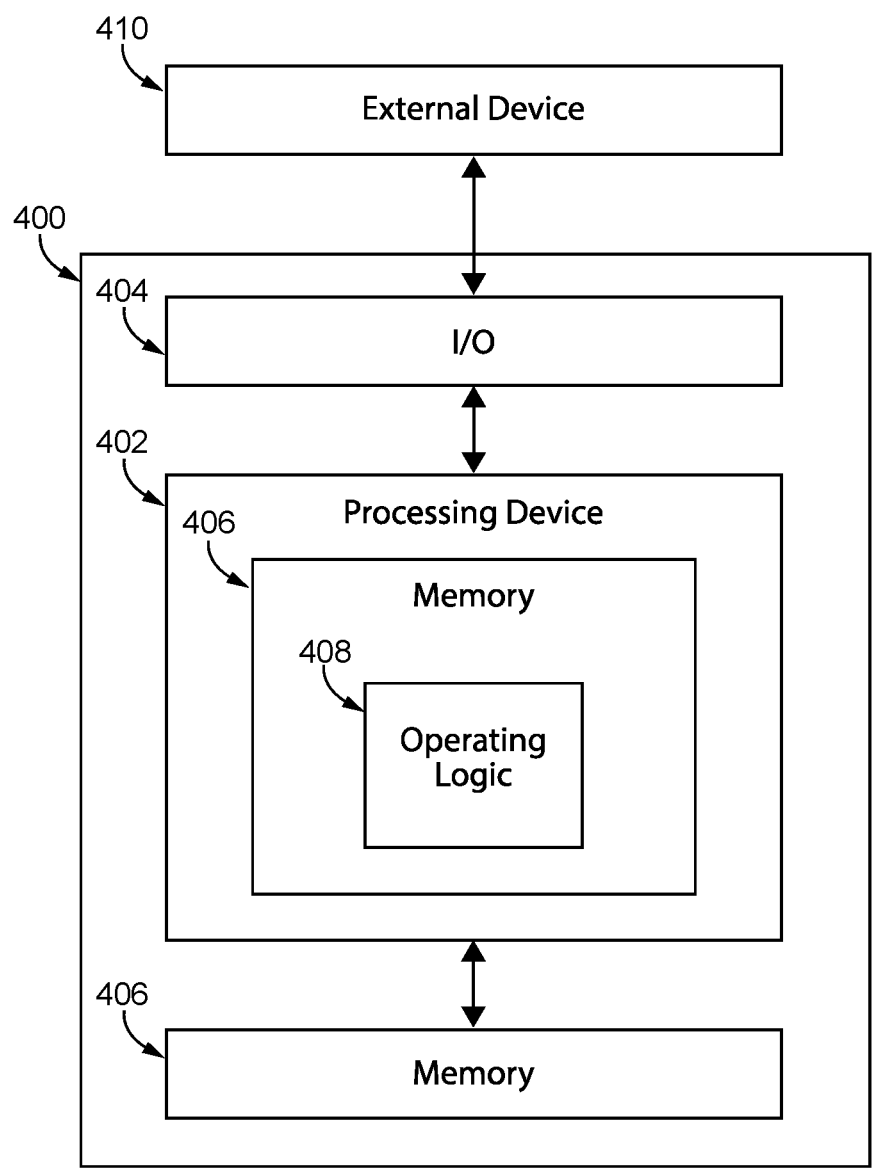
FIG. 9 is a schematic block diagram of a computing device that may be utilized in connection with certain embodiments.

Referring now to FIG. 9, a simplified block diagram of at least one embodiment of a computing device 400 is shown. The illustrative computing device 400 depicts at least one embodiment of a controller that may be utilized in connection with the controllers 96, 110, 210, 310 illustrated in in FIGS. 2-8.

Depending on the particular embodiment, the computing device 400 may be embodied as a server, desktop computer, laptop computer, tablet computer, notebook, netbook, Ultrabook™ mobile computing device, cellular phone, smartphone, wearable computing device, personal digital assistant, Internet of Things (IoT) device, reader device, access control device, control panel, processing system, router, gateway, and/or any other computing, processing, and/or communication device capable of performing the functions described herein.

The computing device 400 includes a processing device 402 that executes algorithms and/or processes data in accordance with operating logic 408, an input/output device 404 that enables communication between the computing device 400 and one or more external devices 410, and memory 406 which stores, for example, data received from the external device 410 via the input/output device 404.

The input/output device 404 allows the computing device 400 to communicate with the external device 410. For example, the input/output device 404 may include a transceiver, a network adapter, a network card, an interface, one or more communication ports (e.g., a USB port, serial port, parallel port, an analog port, a digital port, VGA, DVI, HDMI, FireWire, CAT 5, or any other type of communication port or interface), and/or other communication circuitry. Communication circuitry may be configured to use any one or more communication technologies (e.g., wireless or wired communications) and associated protocols (e.g., Ethernet, Bluetooth®, Bluetooth Low Energy (BLE), Wi-Fi®, WiMAX, etc.) to effect such communication depending on the particular computing device 400. The input/output device 404 may include hardware, software, and/or firmware suitable for performing the techniques described herein.

The external device 410 may be any type of device that allows data to be inputted or outputted from the computing device 400. For example, in various embodiments, the external device 410 may be embodied as the keypad 92, the antenna 94, the capacitive touch keypad matrix 202, or the antenna 304. Further, in some embodiments, the external device 410 may be embodied as another computing device, switch, diagnostic tool, controller, printer, display, alarm, peripheral device (e.g., keyboard, mouse, touch screen display, etc.), and/or any other computing, processing, and/or communication device capable of performing the functions described herein. Furthermore, in some embodiments, it should be appreciated that the external device 410 may be integrated into the computing device 400.

The processing device 402 may be embodied as any type of processor(s) capable of performing the functions described herein. In particular, the processing device 402 may be embodied as one or more single or multi-core processors, microcontrollers, or other processor or processing/controlling circuits. For example, in some embodiments, the processing device 402 may include or be embodied as an arithmetic logic unit (ALU), central processing unit (CPU), digital signal processor (DSP), and/or another suitable processor(s). The processing device 402 may be a programmable type, a dedicated hardwired state machine, or a combination thereof. Processing devices 402 with multiple processing units may utilize distributed, pipelined, and/or parallel processing in various embodiments. Further, the processing device 402 may be dedicated to performance of just the operations described herein, or may be utilized in one or more additional applications. In the illustrative embodiment, the processing device 402 is of a programmable variety that executes algorithms and/or processes data in accordance with operating logic 408 as defined by programming instructions (such as software or firmware) stored in memory 406. Additionally or alternatively, the operating logic 408 for processing device 402 may be at least partially defined by hardwired logic or other hardware. Further, the processing device 402 may include one or more components of any type suitable to process the signals received from input/output device 404 or from other components or devices and to provide desired output signals. Such components may include digital circuitry, analog circuitry, or a combination thereof.

The memory 406 may be of one or more types of non-transitory computer-readable media, such as a solid-state memory, electromagnetic memory, optical memory, or a combination thereof. Furthermore, the memory 406 may be volatile and/or nonvolatile and, in some embodiments, some or all of the memory 406 may be of a portable variety, such as a disk, tape, memory stick, cartridge, and/or other suitable portable memory. In operation, the memory 406 may store various data and software used during operation of the computing device 400 such as operating systems, applications, programs, libraries, and drivers. It should be appreciated that the memory 406 may store data that is manipulated by the operating logic 408 of processing device 402, such as, for example, data representative of signals received from and/or sent to the input/output device 404 in addition to or in lieu of storing programming instructions defining operating logic 408. As illustrated, the memory 406 may be included with the processing device 402 and/or coupled to the processing device 402 depending on the particular embodiment. For example, in some embodiments, the processing device 402, the memory 406, and/or other components of the computing device 400 may form a portion of a system-on-a-chip (SoC) and be incorporated on a single integrated circuit chip.

In some embodiments, various components of the computing device 400 (e.g., the processing device 402 and the memory 406) may be communicatively coupled via an input/output subsystem, which may be embodied as circuitry and/or components to facilitate input/output operations with the processing device 402, the memory 406, and other components of the computing device 400. For example, the input/output subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The computing device 400 may include other or additional components, such as those commonly found in a typical computing device (e.g., various input/output devices and/or other components), in other embodiments. It should be further appreciated that one or more of the components of the computing device 400 described herein may be distributed across multiple computing devices. In other words, the techniques described herein may be employed by a computing system that includes one or more computing devices. Additionally, although only a single processing device 402, I/O device 404, and memory 406 are illustratively shown in FIG. 9, it should be appreciated that a particular computing device 400 may include multiple processing devices 402, I/O devices 404, and/or memories 406 in other embodiments. Further, in some embodiments, more than one external device 410 may be in communication with the computing device 400.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected.

It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. An access control device, comprising:
    a controller; and
    a capacitive touch keypad matrix, comprising:
        a plurality of touch-sensitive key locations comprising a first key location and a second key location, wherein the first key location is located in a first column and a first row, and wherein the second key location is located in the first column and a second row;
        at least one first line connecting the first column with the controller;
        a second line connecting the first key location with the controller; and
        a third line connecting the second key location with the controller;
    wherein the at least one first line comprises:
        a first line first branch connected between a junction and the first key location;
        a first line second branch connected between the junction and the second key location; and
        a first line third branch connected between the junction and the controller; and
    wherein the first line first branch, the first line third branch, and the second line electrically connect the first key location to the controller in a first signal transmission loop, and wherein the first line second branch, the first line third branch, and the third line electrically connect the second key location to the controller in a second signal transmission loop, so that the first key location and the second key location are connected with and transmit signals to and receive signals from the controller in electrical parallel with one another.

2. The access control device of claim 1, wherein the first line third branch extends from the junction parallel to and between the first and second rows.

3. The access control device of claim 2, wherein the junction is a three-way junction.

4. The access control device of claim 2, wherein the first key location and the second key location are positioned on opposite sides of the junction.

5. The access control device of claim 1, wherein the plurality of touch-sensitive key locations further comprises a third key location and a fourth key location;
    wherein the third key location is located in a second column and the first row;

wherein the fourth key location is located in the second column and the second row;

wherein the apparatus further comprises at least one fourth line connecting the second column with the controller;

wherein the at least one fourth line comprises:
  a fourth line first branch connected between the controller and the third key location; and
  a fourth line second branch connected between the controller and the fourth key location; and wherein the fourth line, the fourth line first branch, and the second line electrically connect the third key location to the controller in a third signal transmission loop, and wherein the fourth line, the fourth line second branch, and the third line electrically connect the fourth key location to the controller in a fourth signal transmission loop, so that the third key location and the fourth key location are connected with and transmit signals to and receive signals from the controller in electrical parallel with one another.

6. The access control device of claim 1, further comprising an antenna connected with the controller and configured to facilitate transmission of an access code to the controller.

7. The access control device of claim 6, wherein the antenna circumferentially surrounds the capacitive touch keypad matrix.

8. The access control device of claim 1, further comprising a printed circuit board, the printed circuit board comprising the capacitive touch keypad matrix.

9. The access control device of claim 8, wherein the printed circuit board further comprises an antenna in communication with the controller and configured to facilitate transmission of an access code to the controller.

10. An access control device, comprising:
  a keypad assembly comprising a printed circuit board, a capacitive touch keypad matrix on the printed circuit board, and an antenna on the printed circuit board substantially coplanar with and circumferentially surrounding the capacitive touch keypad matrix; and
  a controller connected with each of the keypad assembly and the antenna such that the controller is operable to receive access codes via each of the keypad assembly and the antenna, wherein the keypad assembly further comprises:
  a plurality of touch sensitive key locations, comprising a first key location and a second key location;
  a first line comprising:
    a first branch connected between a junction and the first key location;
    a second branch connected between the junction and the second key location; and
    a third branch connected between the junction and the controller;
  a second line connected between the first key location and the controller; and
  a third line connected between the second key location and the controller; and
  wherein the first branch, the third branch, and the second line electrically connect the first key location to the controller in a first signal transmission loop, and wherein the second branch, the third branch, and the third line electrically connect the second key location to the controller in a second signal transmission loop, so that the first key location and the second key location are connected with and transmit signals to and receive signals from the controller in electrical parallel with one another.

11. The access control device of claim 10, wherein the controller is configured to transmit an unlock signal in response to receiving an authorized access code via either of the keypad assembly and the antenna.

12. The access control device of claim 10, wherein the first line is a transmit line;
  wherein the second line is a receive line; and
  wherein the controller is configured to transmit signals via the transmit line, to receive the signals via the receive line, and to determine key touches based upon the received signals.

* * * * *